(12) United States Patent
Koike et al.

(10) Patent No.: US 10,529,875 B2
(45) Date of Patent: Jan. 7, 2020

(54) SOLAR CELL AND PRODUCTION METHOD THEREFOR

(71) Applicant: Material Concept, Inc., Sandai, Miyagi (JP)

(72) Inventors: Junichi Koike, Miyagi (JP); Yuji Sutou, Miyagi (JP); Daisuke Ando, Miyagi (JP); Tri Hai Hoang, Miyagi (JP)

(73) Assignee: MATERIAL CONCEPT, INC., Sendai, Miyagi (JP)

( * ) Notice: Subject to any disclaimer, the term of this patent is extended or adjusted under 35 U.S.C. 154(b) by 0 days.

(21) Appl. No.: 15/106,963

(22) PCT Filed: Dec. 22, 2014

(86) PCT No.: PCT/JP2014/083971
§ 371 (c)(1),
(2) Date: Jun. 21, 2016

(87) PCT Pub. No.: WO2015/098873
PCT Pub. Date: Jul. 2, 2015

(65) Prior Publication Data
US 2016/0329444 A1 Nov. 10, 2016

(51) Int. Cl.
*H01L 31/0224* (2006.01)
*H01L 31/068* (2012.01)
(Continued)

(52) U.S. Cl.
CPC ......... *H01L 31/022466* (2013.01); *H01L 31/02168* (2013.01); *H01L 31/022425* (2013.01);
(Continued)

(58) Field of Classification Search
CPC ......... H01L 31/022466; H01L 31/1884; H01L 31/02168; H01L 31/068; H01L 31/022425
See application file for complete search history.

(56) References Cited

U.S. PATENT DOCUMENTS 7,888,594 B2    2/2011 Lu et al.
2004/0200520 A1 10/2004 Mulligan et al.
(Continued)

FOREIGN PATENT DOCUMENTS

EP    2851907 A1    3/2015
JP    2000058888 A    2/2000
(Continued)

OTHER PUBLICATIONS

English machine translation of JP 2012-222171, obtained Jul. 20, 2017.*
(Continued)

*Primary Examiner* — Liesl C Baumann
(74) *Attorney, Agent, or Firm* — Cantor Colburn LLP

(57) ABSTRACT

The present invention is provided with an interface layer that minimizes interdiffusion between a silicon substrate and copper electrode wiring that are used as a solar cell, that improves the adhesive properties of copper wiring, and that is used to obtain ohmic contact characteristics. This silicon solar cell comprises a silicon substrate and is provided with a metal oxide layer that is formed on the silicon substrate and wiring that is formed on the metal oxide layer and that comprises mainly copper. The metal oxide layer contains (a) one of either titanium or manganese, (b) one of vanadium, niobium, tantalum, or silicon, and (c) at least one of copper and nickel. In addition, the metal oxide layer comprises copper or nickel as metal particles that are diffused in the interior of the metal oxide layer.

15 Claims, 1 Drawing Sheet

(51) Int. Cl.
*H01L 31/0216* (2014.01)
*H01L 31/18* (2006.01)

(52) U.S. Cl.
CPC ........ *H01L 31/068* (2013.01); *H01L 31/1884* (2013.01); *Y02E 10/547* (2013.01)

(56) References Cited

U.S. PATENT DOCUMENTS

| | | |
|---|---|---|
| 2005/0218519 A1 | 10/2005 | Koike et al. |
| 2009/0243112 A1 | 10/2009 | Koike et al. |
| 2010/0243058 A1 | 9/2010 | Meguro et al. |
| 2011/0057317 A1 | 3/2011 | Koike et al. |
| 2011/0272009 A1 | 11/2011 | Cabral, Jr. et al. |
| 2012/0060912 A1 | 3/2012 | Cho et al. |
| 2012/0291844 A1 | 11/2012 | Tsuge |
| 2012/0305060 A1 | 12/2012 | Fu et al. |
| 2014/0020753 A1* | 1/2014 | Goto ............... H01L 31/022441 136/256 |
| 2015/0136219 A1 | 5/2015 | Koike et al. |

FOREIGN PATENT DOCUMENTS

| | | |
|---|---|---|
| JP | 2004266023 A | 9/2004 |
| JP | 2005277390 A | 10/2005 |
| JP | 2006523025 A | 10/2006 |
| JP | 2009117463 A | 5/2009 |
| JP | 2009231739 A | 10/2009 |
| JP | 2010230965 A | 10/2010 |
| JP | 2011061187 A | 3/2011 |
| JP | 2011171334 A | 9/2011 |
| JP | 2011199045 A | 10/2011 |
| JP | 2011238903 A | 11/2011 |
| JP | 2012060123 A | 3/2012 |
| JP | WO 2012132854 A1 * | 10/2012 ..... H01L 31/022441 |
| JP | 2012222171 A | 11/2012 |
| JP | WO 2012146661 A1 * | 11/2012 ............... H01B 1/08 |
| JP | 2013089665 A | 5/2013 |
| JP | 2013206722 A | 10/2013 |
| JP | 2014154737 A | 8/2014 |
| WO | 2013172362 A1 | 11/2013 |

OTHER PUBLICATIONS

AEM. "Polycrystalline Copper." http://www.aem.umn.edu/people/faculty/shield/c1b1/pcb4.htm. Screenshot from Jul. 10, 2010.*
Machine translation of JP 2012-222171 (Year: 2012).*
Corrossionpedia. "Definition of Precipitate." Accessed online Jun. 6, 2019. https://www.corrosionpedia.com/definition/924/precipitate (Year : 2019).*
B.S.Richards et al., Proceedings of 28th IEEE Photovoltaic Specialists Conference (PVSC 2000).
E.J.Lee et al., Solar Energy Materials and Solar Cells, vol. 74, pp. 65-70 (2002).
Imahori et al., Langumuir, vol. 22, pp. 11405-11411 (2006).
International Search Report corresponding to Application No. PCT/JP2014/083971; dated Jan. 27, 2013, with English translation.
J.-H.Guo and J.E.Cotter, Solar Energy Materials and Solar Cells, vol. 86, pp. 485-498 (2005).
J.Kang et al., Solar Energy Materials and Solar Cells, vol. 74, pp. 91-96 (2002).
J.Koike and M.Wada, Applied Physics Letters, vol. 87, 041911 (2005).
Notice of Reasons for Rejection issued to JP Application No. 2013-265871, dated Dec. 16, 2014.
S.K.Matlow and E.L.Ralph, Solid-State Electronics, vol. 2, pp. 202-208 (1961).
S.Yamada et al., Proceedings of 37th IEEE Photovoltaic Specialists Conference (PVSC 2011).
Extended European Search Report for corresponding European Patent Application No. 14875016.9; dated Dec. 2, 2016.

* cited by examiner

SOLAR CELL AND PRODUCTION METHOD THEREFOR

This is the U.S. national stage of application No. PCT/JP2014/083971, filed on Dec. 22, 2014. Priority under 35 U.S.C. § 119(a) and 35 U.S.C. § 365(b) is claimed from Japanese Application No. 2013-265871, filed Dec. 24, 2013, the disclosure of which is also incorporated herein by reference.

TECHNICAL FIELD

The present invention relates to a silicon solar cell comprising copper-based metal wiring, and also relates to a method of manufacturing the above silicon solar cell.

BACKGROUND ART

In a solar cell having a silicon substrate, silver is commonly used for collector electrode wiring. Considering that the cost of silver as a raw material, which accounts for 20% or more of the total material cost of a solar cell, has been soaring in recent years, substitution of lower cost copper for silver has been demanded in order to reduce the price of a solar cell.

However, copper (Cu) and silicon (Si) undergo interdiffusion to form copper silicide. Further, copper rapidly diffuses into a region of silicon to form an acceptor level at an energy position deep in the band gap of silicon. Since these phenomena may be responsible for deteriorated properties of a solar cell, a diffusion barrier layer is required between copper and silicon in order to minimize interdiffusion of copper and silicon.

Moreover, due to the difference in the work functions of copper and silicon, the electrical contact characteristics at an interface between a copper region and silicon region is of Schottky contacts, and an interface with high contact resistance is formed. This will be accompanied by significant power loss when electric power generated inside a silicon cell is retrieved outside. In order to reduce this type of electric power loss as much as possible, an approach required is for increasing the concentration of an impurity in a contact region of silicon to reduce resistance. Further, the aforementioned diffusion barrier layer needs to have low electrical resistance so that the electrical contact characteristics at the interface are of ohmic contacts.

Furthermore, when cells are connected to each other to form a module, cells are connected (stringed) through a soldered (tabbed) wiring material (tab ribbon). Therefore, good adhesiveness is required between copper wiring and a silicon substrate.

There have been many previous reports about forming interface layers which satisfy the aforementioned requirements.

As a first type of interface layers, metal alloys and compounds have been proposed.

For example, Nonpatent Document 1 describes an electrode formed by depositing nickel on a silicon substrate by the electroless plating method, and forming nickel silicide in a subsequent heat treatment, and then further forming copper by the electrolytic plating method.

Nonpatent Document 2 also proposes to form nickel by the electroless plating method as well.

Nonpatent Document 3 describes an electrode formed by depositing gold on a silicon substrate by the displacement plating method, and then forming copper by the electrolytic plating method.

Nonpatent Document 4 describes an electrode formed by depositing a lamination layer of a titanium thin film and a copper thin film on a silicon substrate by the thermal deposition method, and then forming a copper thick film by the electrolytic plating method.

Patent Document 1 (Japanese Patent Application Laid-Open No. 2011-238903) proposes that ohmic contacts are obtained by depositing nickel or cobalt on a silicon substrate and performing rapid heating to form silicide, and any of NiP, CoP or CoWP is further formed to obtain a diffusion barrier layer, and Cu is then deposited.

Patent Document 2 (Japanese Patent Application Laid-Open No. 2012-60123) describes a diffusion barrier layer obtained by depositing aluminum (Al) as a first metal film on a silicon substrate using the vapor deposition method, and further depositing titanium tungsten (TiW) as a second metal film.

Patent Document 3 (Japanese Patent Application Laid-Open No. 2004-266023) proposes that any of Ti, Ni, Cr or Pt is deposited on a silicon substrate using the vapor deposition method to obtain a diffusion barrier layer.

Patent Document 4 (Japanese Translation of PCT International Application Publication No. 2006-523025) proposes that any of Ti, W or Cr is deposited to obtain a diffusion barrier layer.

In any of the above cases, the electrical resistance at an interface layer shows a low value, and the ohmic contact characteristics can be obtained. However, copper will diffuse into silicon through the entire interface layer or through the grain boundary in the interface layer as diffusion routes, and thus good diffusion barrier characteristics can not be obtained for the interface layer. Therefore, disadvantageously, the long-term reliability, which is a requirement for a solar cell, is inferior.

As a second type of interface layers, transparent conducting films (TCO: Transparent Conductive Oxide) have been proposed.

In Patent Document 5 (Japanese Patent Application Laid-Open No. 2000-58888), a transparent conducting film is formed on the surface of a low resistance noncrystalline silicon semiconductor layer in which a high concentration of an impurity is doped, and a metal collector electrode is then formed thereon to facilitate current conduction between the collector electrode and the noncrystalline silicon. TCOs in this case are indium tin oxide (ITO), zinc oxide (ZnO) and tin oxide (SnO2), which are intended to adjust an oxygen content for reducing electrical resistance.

Patent Document 6 (Japanese Patent Application Laid-Open No. 2011-199045) describes a method in which a TCO is formed on the surface of a noncrystalline silicon semiconductor layer, and a translucent insulating layer is formed thereon, and a collector electrode is further formed thereon by the plating method to make contact with the noncrystalline silicon semiconductor through a groove-like opening provided at the translucent insulating layer. TCOs are not specified, but translucent insulating layers are specified as SiO2, SiN, TiO2 and Al2O3.

In Patent Document 7 (US 2012/0305060), a quantum tunneling barrier layer is formed on the surface of an n-type silicon substrate, and a surface electric field layer is formed thereon comprising noncrystalline silicon in which a high concentration of an impurity is doped, and a TCO is formed thereon to further form a copper or nickel electrode thereon. Quantum tunneling barrier layers are specified as SiOx, SiNx, AlOx and SiON, and TCOs are specified as ITO, SnOx, Al-doped ZnO (AZO) and Ga-doped ZnO (GZO).

In any of the above cases, the electrical resistance at a TCO interface layer shows a low value, and the ohmic contact characteristics can be obtained. However, when a collector electrode is sintered at a high temperature, a TCO is reduced by silicon to change its properties, and insulating SiO2 is formed at an interface because an oxide to become a TCO is less stable than SiO2. Therefore, disadvantageously, the ohmic contact characteristics are deteriorated.

Further, disadvantageously, the adhesiveness between copper wiring and a transparent conducting film will be insufficient. Patent Document 6 proposes that an additional interface layer comprising Ti, TiN, TiW, Ta, TaN, WN, Co is formed in order to obtain adhesiveness with a diffusion barrier layer.

In recent years, titanium oxides have been attracting attention as new TCO materials. TiO2 is advantageous in that it will not be reduced upon contact with silicon at a high temperature because it is a more stable oxide than SiO2.

Nonpatent Document 5 proposes that a TCO layer comprising Nb-doped TiO2 is formed at an interface between an n++ polycrystalline silicon layer and a quantum dot layer. The document describes that heat treatment at 900° C. is required to form a quantum dot layer, and the presence of a TCO layer when performing the above heat treatment can prevent phosphorus (P), an impurity element in an n++ polycrystalline silicon layer, from diffusing into the quantum dot layer.

Nonpatent Document 6 describes that P-doped TiO2 shows diffusion barrier characteristics against P.

Patent Document 8 (U.S. Pat. No. 7,888,594) describes that Nb-doped TiOx or Nb- or Al-doped TiZnOx can improve the conversion efficiency of a solar cell due to their larger refractive index and light transmittance as compared with those of TiOx.

TiO2 is also used as an electrode of a dye-sensitized solar cell.

Nonpatent Document 7 describes that Nb, Ge, Zr-doped TiO2 used in an electrode can improve the efficiency of a dye-sensitized solar cell.

However, these prior art documents do not include any statement with regard to whether or not a Ti oxide can serve as a diffusion barrier layer between copper and silicon in a silicon solar cell having copper wiring, neither does any statement of implementation of it.

A third type of interface layers is a diffusion barrier layer for a semiconductor integrated circuit (LSI) having a similar lamination structure although it is not intended for use in a solar cell. An oxide comprising manganese and silicon has been reported to be effective as a diffusion barrier layer between Cu and SiO2.

For example, Nonpatent Document 8 describes that MnSixOy formed at an interface by depositing a Cu—Mn alloy on a SiO2 insulator layer and performing heat treatment has excellent diffusion barrier characteristics against interdiffusion between Cu and SiO2.

Patent Document 9 (Japanese Patent Application Laid-Open No. 2005-277390) proposes a diffusion barrier layer mainly comprising a material selected from the group consisting of MnxOy, MnxSiyOz, MnxCyOz and MnxFyOz, the diffusion barrier layer having an effect of preventing interdiffusion between a Cu-based wiring layer and an interlaminar insulating layer comprising any of Si, C, F, O.

Patent Document 10 (Japanese Patent Application Laid-Open No. 2009-231739) describes that when Mn in a Cu alloy reacts with a SiOC insulating layer, an oxide comprising Mn, C and H is formed, showing an effect of preventing interdiffusion between Cu and SiOC.

However, these reports and inventions relate to interface layers having diffusion barrier characteristics between an insulating layer of SiO2, SiOC and the like and Cu, and the interface layers need to be electrically insulating in nature. Therefore, a problem is that the electrical conductivity between copper and a Si substrate, i.e., good ohmic contact characteristics can not be obtained when these interface layers are applied to solar cells.

In contrast to these reports, an attempt has been reported to reconcile the diffusion barrier characteristics and the electric conductivity between a silicon substrate and Cu without inclusion of an insulating layer in a contact plug structure.

Patent Document 11 (Japanese Patent Application Laid-Open No. 2011-61187) describes that Ni or Co silicide is formed on a highly-doped n-type Si substrate to obtain the ohmic contact characteristics with the Si substrate, and an Mn oxide is further formed on the silicide to confer a function as a diffusion barrier layer. However, a problem is that the silicide non-uniformly enters into an emitter layer near the surface of the Si substrate due to the non-uniform thickness of the silicide, resulting in deteriorated performance of a solar cell.

Patent Document 12 (Japanese Patent Application Laid-Open No. 2011-171334) describes that the oxygen plasma treatment was performed on a silicide surface to form an oxide, allowing for improved interface adhesiveness, and excellent diffusion barrier characteristics were able to be obtained by forming lamination oxides of $Mn\alpha Si\beta O\gamma$ and MnOx. However, the thickness of the oxide formed on the silicide surface needs to be limited to 1.5 nm or less since the oxide is highly resistive. As a consequence, the oxide can not be formed on the entire area of a solar battery cell in a uniform thickness, resulting in insufficient diffusion barrier characteristics.

Patent Document 1: Japanese Unexamined Patent Application, Publication No. 2011-238903
Patent Document 2: Japanese Unexamined Patent Application, Publication No. 2012-60123
Patent Document 3: Japanese Unexamined Patent Application, Publication No. 2004-266023
Patent Document 4: Japanese Unexamined Patent Application (Translation of PCT Application), Publication No. 2006-523025
Patent Document 5: Japanese Unexamined Patent Application, Publication No. 2000-58888
Patent Document 6: Japanese Unexamined Patent Application, Publication No. 2011-199045
Patent Document 7: U.S. Published Patent Application Publication, No. 2012/0305060, Specification
Patent Document 8: U.S. Pat. No. 7,888,594, Specification
Patent Document 9: Japanese Unexamined Patent Application, Publication No. 2005-277390
Patent Document 10: Japanese Unexamined Patent Application, Publication No. 2009-231739
Patent Document 11: Japanese Unexamined Patent Application, Publication No. 2011-61187
Patent Document 12: Japanese Unexamined Patent Application, Publication No. 2011-171334
Non-Patent Document 1: E. J. Lee et al., Solar Energy Materials and Solar Cells, vol. 74, pp. 65-70(2002)
Non-Patent Document 2: J.-H. Guo and J. E. Cotter, Solar Energy Materials and Solar Cells, vol. 86, pp. 485-498 (2005)
Non-Patent Document 3: S. K. Matlow and E. L. Ralph, Solid-State Electronics, vol. 2, pp. 202-208(1961)

Non-Patent Document 4: J. Kang et al., Solar Energy Materials and Solar Cells, vol. 74, pp. 91-96(2002)

Non-Patent Document 5: S. Yamada et al., Proceedings of 37th IEEE Photovoltaic Specialists Conference (PVSC 2011)

Non-Patent Document 6: B. S. Richards et al., Proceedings of 28th IEEE Photovoltaic Specialists Conference (PVSC 2000)

Non-Patent Document 7: Imahori et al., Langumuir, vol. 22, pp. 11405-11411(2006)

Non-Patent Document 8: J. Koike and M. Wada, Applied Physics Letters, vol. 87, 041911(2005)

DISCLOSURE OF THE INVENTION

Problems to be Solved by the Invention

A solar cell having a copper collector electrode and a silicon substrate requires an interface layer having excellent adhesion strength and good ohmic contact characteristics in which interdiffusion between copper and silicon is minimized. Those interface layers comprising metal alloys and compounds which are disclosed in Patent Documents 1 to 4 and Nonpatent Documents 1 to 4 have a disadvantage in that their diffusion barrier characteristics are not durable enough for long-term use.

Those interface layers comprising transparent conducting films (TCOs) which are disclosed in Patent Documents 5 to 8 and Nonpatent Documents 5 to 7 have insufficient adhesiveness and diffusion barrier characteristics. Further, barrier characteristics are unknown for a Ti oxide.

Those oxides comprising manganese and silicon in diffusion barrier layers of LSI which are disclosed in Patent Documents 9 to 10 and Nonpatent Document 8 are insulating materials, and thus have problematic ohmic contact characteristics.

The present invention is made in view of such circumstances. An objective of the present invention is to provide an interface layer for minimizing interdiffusion between a silicon substrate and copper electrode wiring for use in a solar cell, for increasing adhesiveness of copper wiring, and for obtaining ohmic contact characteristics. Another objective is to provide a method of forming an interface layer.

Means for Solving the Problems

The present invention is characterized by a silicon solar cell having a silicon substrate, comprising: a metal oxide layer formed on the silicon substrate and copper-based wiring formed on the metal oxide layer, wherein the metal oxide layer comprises (a) either one of titanium or manganese, (b) any one of vanadium, niobium, tantalum or silicon and (c) at least one of copper and nickel.

By providing a metal oxide layer comprising each element of the above (a) to (c) between the copper-based wiring (hereinafter referred to as "copper wiring") and the silicon substrate, formed is an interface layer having a diffusion barrier function for preventing copper from entering into between the copper wiring and the silicon substrate. Therefore, inexpensive copper can be used for wiring of a solar cell. Further, the good adhesiveness and low electrical resistance of the above metal oxide layer can increase the conversion efficiency of a solar cell.

The present invention is characterized by the silicon solar cell having a silicon substrate, comprising: an antireflection film formed on the silicon substrate and having an opening; a metal oxide layer formed at least on the silicon substrate within the opening; and copper-based wiring formed at least on the metal oxide layer, wherein the metal oxide layer comprises (a) either one of titanium or manganese, (b) any one of vanadium, niobium, tantalum or silicon and (c) at least one of copper and nickel.

By providing an antireflection film on the silicon substrate, career recombination on the surface of the silicon substrate can be minimized, and reflection of incident light can be reduced. Therefore, the conversion efficiency can be improved.

The present invention encompasses those in which the opening of the antireflection film has a shape in accordance with a pattern of the above wiring.

The present invention encompasses those in which the above wiring is formed on the metal oxide layer and further extended to and formed on the antireflection film.

The present invention encompasses those in which the metal oxide layer is formed on the silicon substrate within the opening, and is further extended to and formed on the antireflection film.

Copper wiring can be filled by virtue of the opening provided at a portion of the antireflection film. The above wiring is formed on the metal oxide layer within the opening of the antireflection film, and further extends to and covers the surface of the antireflection film. Therefore, adhesiveness can be enhanced.

According to the present invention, the above metal oxide layer can comprise 2 atom % or more to 15 atom % or less of vanadium, niobium or tantalum. Since 2 atom % or more to 10 atom % or less of vanadium, niobium or tantalum is contained in the above metal oxide layer, an electric resistivity in a range as low as 1 Ωcm or less can be obtained.

According to the present invention, the above metal oxide layer can comprise 20 atom % or more to 60 atom % or less of silicon. Silicon contained in the above range can contribute to improved adhesiveness with a silicon substrate.

According to the present invention, the above metal oxide can comprise 5 atom % or more to 20 atom % or less of copper and nickel in total. Copper and nickel contained in the above range can improve the adhesiveness and diffusion barrier characteristics between copper wiring and a silicon substrate.

The present invention is characterized by copper or nickel being dispersed as metal particles in the inside of the metal oxide layer.

Metal particles dispersed in the inside of the metal oxide layer can further reduce the electrical resistance of the metal oxide layer, and can also enhance the adhesion strength between copper wiring and a silicon substrate.

The present invention encompasses those in which the above wiring has a polycrystal structure, and the void volume ratio is 30% or less, and the mean crystal grain diameter is 0.5 μm or more to 3.0 μm or less.

In a case where the void volume ratio is 30% or less, the electric resistivity of copper wiring of 5 μΩcm or less can be achieved. In a case where the mean grain diameter is 3.0 μm or less, disconnection of copper wiring on a textured silicon substrate can be prevented. In a case where it is 0.5 μm or more, a broadened bottom of wiring after printing copper wiring can be minimized.

The present invention is characterized by a method of manufacturing a silicon solar cell having a silicon substrate, the method comprising the steps of: forming a metal oxide layer on the silicon substrate, and forming copper-based wiring on the metal oxide layer, wherein the metal oxide layer comprises (a) either one of titanium or manganese, (b)

any one of vanadium, niobium, tantalum or silicon and (c) at least one of copper and nickel.

The present invention is characterized by a method of manufacturing a silicon solar cell having a silicon substrate, the method comprising the steps of: forming an antireflection film having an opening on the silicon substrate, forming a metal oxide layer at least on the silicon substrate within the opening and forming copper-based wiring at least on the metal oxide layer, wherein the metal oxide layer comprises (a) either one of titanium or manganese, (b) any one of vanadium, niobium, tantalum or silicon and (c) at least one of copper and nickel.

According to the present invention, the step of forming a metal oxide layer may comprises: applying a raw material solution of elements constituting the metal oxide on the silicon substrate by the wet application method, and then performing heat treatment at a temperature of 400° C. or more to 700° C. or less under an oxygen-containing atmosphere, thereby forming the metal oxide layer.

The metal oxide layer can be formed by applying a raw material solution by the wet application method, and performing calcination under predetermined conditions.

In the manufacturing method according to the present invention, the step of forming a metal oxide layer may comprise: forming the metal oxide layer, and then performing heat treatment at a temperature of 350° C. or more to 600° C. or less under an atmosphere containing carbon monoxide, alcohol or hydrogen to reduce the metal oxide and precipitate metal particles of copper or nickel.

By heat-treating a metal oxide layer under predetermined conditions and under a reducing atmosphere, a structure can be obtained in which metal particles are finely precipitated in the inside of the metal oxide layer.

According to the present invention, the step of forming wiring may comprise: printing and applying a copper paste on the metal oxide layer, and then performing a first heat treatment at a temperature of 350° C. or more to 600° C. or less under an oxygen-containing atmosphere, and then performing a second heat treatment at a temperature of 350° C. or more to 600° C. or less under an atmosphere containing carbon monoxide, alcohol or hydrogen.

The present invention includes reducing the metal oxide and precipitating metal particles of copper or nickel in the inside of the metal oxide layer by the second heat treatment.

A layer of copper wiring can be formed on a metal oxide layer by applying a copper paste containing copper particles by the wet application method, and then performing calcination in accordance with the first heat treatment at predetermined conditions under an oxidizing atmosphere to remove solvent and resin, and then performing calcination in accordance with the second heat treatment at predetermined conditions under an reducing atmosphere to sinter the copper particles. Further, depending on the heat treatment conditions at the second heat treatment, a metal oxide layer is reduced and metal particles of copper or nickel are precipitated within the reduced metal oxide layer.

According to the present invention, the step of forming a metal oxide layer may comprise use of the chemical vapor deposition method or the sputtering method.

According to the present invention, the opening of the antireflection film may be formed into a wiring pattern by the laser ablation method or the chemical etching method.

Effects of the Invention

The present invention represents a silicon solar cell in which a metal oxide layer formed on a silicon substrate which is configured by combining each element of the aforementioned (a) to (c), and copper wiring is formed on that metal oxide layer. The above metal oxide layer can minimize interdiffusion between the silicon substrate and the copper wiring. Further, the aforementioned metal oxide layer has excellent adhesiveness with both the copper wiring and the silicon substrate, and has low electrical resistance. Therefore, good ohmic contact characteristics with less losses when electric current flows between the copper wiring and the silicon substrate can be obtained. Inexpensive copper-based metal wiring used therein can allow for large cost reduction. Low wiring and low contact resistances can reduce theseries resistance of a cell, leading to improved conversion efficiency. Further, the combined use of an antireflection film formed on a silicon substrate can minimize career recombination, and can reduce reflection of incident light. Therefore, the conversion efficiency can be further improved.

The present invention relates to a method of manufacturing a silicon solar cell, the method comprising: forming a metal oxide layer formed by combining each element of the aforementioned (a) to (c) on a silicon substrate, and forming copper wiring on the metal oxide layer. The present invention also relates to the aforementioned method, further comprising forming an antireflection film on the silicon substrate. An electrode structure in which a predetermined layer having the aforementioned excellent properties are layered can efficiently be manufactured by using methods of forming a thin film such as the wet application, the chemical vapor deposition method and the sputtering method.

PREFERRED MODE FOR CARRYING OUT THE INVENTION

Below, the solar cell according to the present invention and the manufacturing method thereof will be described in detail.

Figure 1:
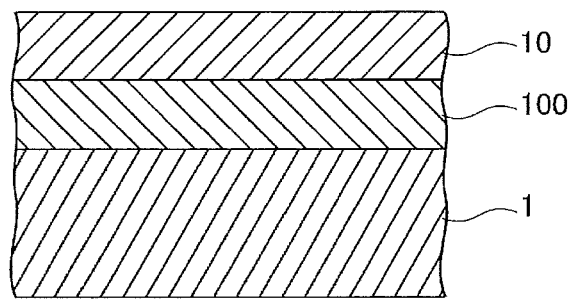
FIG. 1 shows a configuration of the solar cell according to the present invention in which a metal oxide layer and wiring are formed on a silicon substrate.

The solar cell according to the present invention is characterized by a metal oxide layer formed on a silicon substrate. FIG. 1 shows a schematic diagram in which a metal oxide layer 100 is formed on a silicon substrate 1, and copper wiring is formed on the metal oxide layer 100. This represents a structure in which the metal oxide layer 100 was formed at an interface between the copper wiring 10 and the silicon substrate 1. Note that a texture structure is omitted in this figure although a silicon substrate of a practical solar cell has an upper surface with an uneven texture structure formed by etching with an alkaline solution and the like.

The metal oxide layer 100 shown in FIG. 1 is formed on the surface of the silicon substrate 1 by a predetermined method, and comprises (a) either one of titanium or manganese, (b) any one of vanadium, niobium, tantalum or silicon and (c) at least one of copper and nickel.

The metal oxide layer 100, which comprises oxides of the above components, can enhance the adhesiveness between the silicon substrate 1 and the copper wiring 10, and can serve as a diffusion barrier layer for preventing copper atoms of the copper wiring from entering into the silicon substrate. Further, it can reduce the interfacial contact resistance to improve the conversion efficiency.

Although the metal oxide layer will be applied on a silicon substrate, the region to be applied is not limited to the interface between a silicon substrate and copper wiring. The metal oxide layer may be formed and arranged throughout the entire surface of a silicon substrate. A metal oxide layer present throughout the entire surface of a silicon substrate can prevent career recombination on the silicon surface, and also show an antireflection effect.

Figure 2:
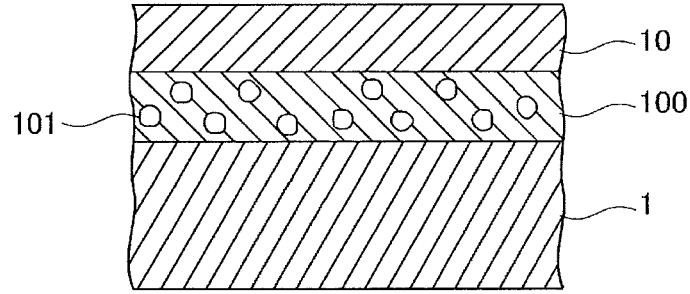
FIG. 2 shows a configuration of the solar cell according to the present invention in which metal particles are formed and dispersed within a metal oxide layer.

With regard to the metal oxide layer formed on a silicon substrate, copper or nickel contained in the metal oxide layer precipitates out as metal particles after performing heat treatment under a reducing atmosphere. As a result, a structure can be obtained in which the metal particles are finely dispersed in the metal oxide layer. FIG. 2 shows a schematic diagram in which metal particles comprising copper or nickel are dispersed within the metal oxide layer.

Metal particles 101 comprising at least one of copper and nickel are finely dispersed within the metal oxide 100 comprising titanium or manganese. Therefore, the metal particles 101 can provide good electrical conductive pathways, and the adhesiveness between the copper wiring and the metal oxide layer can be improved. Further, a case in which nickel is contained in the metal particle 101 is preferred because nickel silicide will be formed at a place with which the silicon substrate 1 makes contact.

Figure 3:
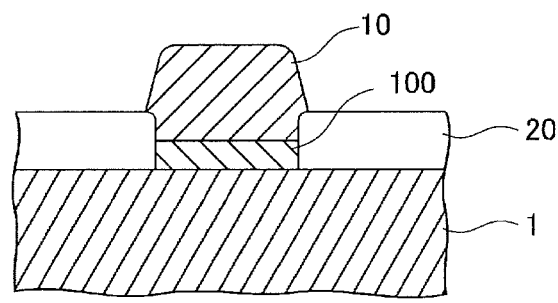
FIG. 3 shows a configuration of the solar cell according to the present invention in which an antireflection film, a metal oxide layer and wiring are formed on a silicon substrate.

FIG. 3 shows a schematic diagram in which an antireflection film 20 having an opening is formed on the surface of the silicon substrate 1, and the metal oxide layer 100 is formed on the silicon substrate within the opening of the antireflection film 20, and the copper wiring 10 is formed on the metal oxide layer 100. A portion of the antireflection film has an opening, and the opening has a shape in accordance with a pattern of the copper wiring.

The copper wiring, which is arranged on the metal oxide layer, may cover the antireflection film within the opening, and may further extend onto and cover the antireflection film around the opening.

The metal oxide layer arranged at the opening can enhance the adhesiveness between the silicon substrate 1 and the copper wiring 10, and can also serve as a diffusion barrier layer for preventing copper atoms of the copper wiring from entering into the silicon substrate. Further, it can reduce the interfacial contact resistance (also referred to as the contact resistance) to improve the conversion efficiency.

Figure 4:
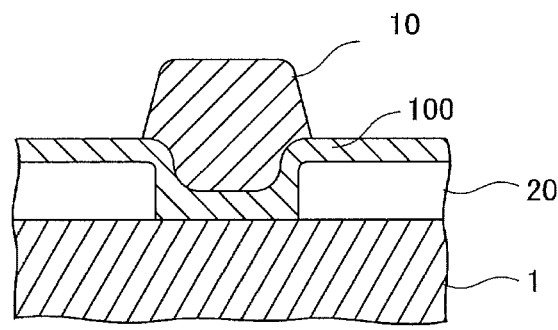
FIG. 4 shows another configuration of the solar cell according to the present invention in which an antireflection film, a metal oxide layer and wiring are formed on a silicon substrate.

The metal oxide layer can also cover the surface of the antireflection films at a place other than the opening. FIG. 4 shows a schematic diagram in which the antireflection film 20 having an opening is formed on the surface of the silicon substrate 1, and the metal oxide layer 100 is formed on the silicon substrate within the opening of the antireflection film 20 and on the antireflection film 20, and the copper wiring 10 is formed on the metal oxide layer 100.

The metal oxide layer 100, which will be arranged on the silicon substrate within the opening, may cover the antireflection film within the opening, and may further extend onto and cover the antireflection film around the opening. The metal oxide layer 100 has a visible light transmittance of 90% or more. Therefore, even if it is formed throughout the entire surface of the antireflection film, the photoelectric conversion efficiency required for practical use can be achieved.

(Silicon Substrate)

A p-type silicon substrate in which an acceptor type impurity such as boron (B) is doped in a monocrystalline silicon substrate can be used. Alternatively, an n-type silicon substrate in which a donor type impurity such as phosphorus (P) is doped may be used.

(Metal Oxide Layer)

The metal oxide layer according to the present invention comprises (a) either one of titanium or manganese, (b) any one of vanadium, niobium, tantalum or silicon and (c) at least one of copper and nickel.

By virtue of the combination of these elements, the metal oxide layer functions as a barrier layer for preventing copper from diffusing into a silicon substrate. Titanium and manganese of (a) mainly contribute to the diffusion barrier characteristics. Vanadium, niobium and tantalum of (b) contribute to the electric conductivity of a metal oxide layer, and silicon has an excellent wettability with an underlying silicon substrate and contributes to the formation of a uniform and homogeneous oxide layer. Copper and nickel of (c) can improve the adhesiveness with copper wiring and the adhesiveness with a silicon substrate, and a peel strength of 1 N/mm or more can be obtained.

Further, the electron energy band gap of the metal oxide may be 2.5 electron volt (eV) or more, and thus a visible light transmittance of 90% or more can be achieved.

According to preferred combinations of the elements, any of vanadium, niobium or tantalum may be added to titanium, and either vanadium or silicon may be added to manganese. According to more preferred combinations of the elements, niobium may be added to titanium, and silicon may be added to manganese. Copper and nickel may be added to any combinations of the elements.

By virtue of 2 atom % or more to 10 atom % or less of vanadium, niobium, tantalum contained in the metal oxide layer, the electric resistivity in a range as low as 1 Ωcm or less can be achieved, leading to increased conversion efficiency. A more preferred content of 4 atom % or more to 7 atom % or less can reduce the electric resistivity to 0.1 Ωcm or less.

The content of silicon in the metal oxide layer is preferably 20 atom % or more to 60 atom % or less in order to obtain good adhesiveness with a silicon substrate.

One example of the composition of the metal oxide is $(Ti_{1-x-y}Nb_xCu_y)O_{2-z}$. In view of the electric resistivity, diffusion barrier characteristics, adhesiveness and visible light transmittance, the following ranges are suitable: $x=0.02$ to $0.1$, $y=0.05$ to $0.2$ and $z=0$ to $0.05$. Further, $x=0.04$ to $0.08$ is preferred because an electric resistivity of $10^{-4}$ Ωcm can be obtained, and $y=0.08$ to $0.13$ is further preferred because the peel strength of 1.5 N/mm or more as a measure of adhesion strength can be obtained, and a visible light transmittance of 90% or more can be maintained. In $(Ti_{1-x-y}Nb_xCu_y)O_{2-z}$, V or Ta may be used in place of Nb, or Ni may be used in place of Cu. Further, the elements Cu and Ni may be added together for use. In any case, similar effects can be obtained.

Similar effects can also be obtained even in the case of $(Mn_{1-x-y}Si_xCu_y)O_z$. In this case, the following ranges are preferred: $x=0.2$ to $0.6$, $y=0.05$ to $0.2$ and $z=1$ to $2$. In a similar way as described above, Ni may be used in place of Cu, and further, the elements Cu and Ni may both be added together for use. In any case, similar effects can be obtained.

The metal oxide layer can be used in a state where copper or nickel enters into solid solution in a metal oxide. Inclusion of copper and/or nickel can strengthen metal bonding with copper wiring, and achieve a peel strength of 1 N/mm or more, and enhance adhesiveness with copper wiring. Further, if adhesion strength needs be to increased, metal particles may be reduced and precipitated for dispersion by performing heat treatment.

In any case, the total concentration of copper and nickel is preferably 5 atom % or more to 20 atom % or less, and in that case, a peel strength of 1 N/mm or more can be obtained. The total concentration is more preferably 8 atom % or more to 15 atom % or less, and in that case, a peel strength of 2 N/mm or more can be obtained.

In a case where the total concentration is less than 5 atom %, the resulting peel strength will be insufficient. In a case where it is more than 20 atom %, added copper and the like will be dispersed over a silicon substrate, resulting in impaired diffusion barrier characteristics between copper wiring and a silicon substrate, and the resulting visible light transmittance will also be reduced to less than 90%. Therefore, these ranges are not preferred.

Preferably, the metal oxide layer has a mean thickness of 10 nm or more to 80 nm or less. In a case where the thickness is 80 nm or less, good electric conductivity is obtained, and good ohmic contact characteristics are also obtained between copper wiring and a silicon substrate. Further, diffusion barrier characteristics can be assured in a case where the thickness is 10 nm or more.

(Copper Wiring)

Copper wiring is formed by sintering copper particles mixed in a copper paste, and has a polycrystalline structure. The void volume ratio thereof is preferably 30% or less in order to reduce the electric resistivity of the wiring. In this case, an electric resistivity of 5 μΩcm or less can be obtained.

The mean crystal grain diameter of copper wiring is preferably 0.5 μm or more to 3.0 μm or less. In a case where the mean grain diameter is more than 3.0 μm, wiring can not be continuously formed along the unevenness in a texture when a thin grid line with a line width of 60 μm or less is to be formed in a textured silicon substrate. This may cause a broken wiring. In a case where the mean crystal grain diameter is less than 0.5 μm, many cycles of printing and heat treatment steps are inefficiently required to obtain a wiring thickness of 15 μm. Further, a broadened bottom of wiring may occur after printing copper wiring. The mean particle diameter of crystal grains is almost equal to the mean particle diameter of a copper powder material. Therefore, a corresponding copper powder can be selected accordingly.

Preferably, the top of copper wiring has a thickness of 10 μm or more to 80 μm or less. In a case where the thickness is less than 10 μm, the thickness of wiring can not be uniformly maintained along the unevenness in a texture formed on a silicon substrate, possibly resulting in broken copper wiring. Therefore, a thickness of less than 10 μm is not preferred. On the other hand, when a wiring with a thickness of more than 80 μm is to be formed, the viscosity of a copper paste needs to be increased excessively. In that case, the heterogeneity of a wiring pattern may not be maintained, and the lifetime of a mask may also be shortened because discharge of a paste from a mask opening may be difficult when performing screen printing. Therefore, the thickness of more than 80 μm is not preferred.

(Antireflection Film)

An antireflection film minimizes career recombination on the surface of a silicon substrate, and also reduces reflection of incident light to increase the amount of incident light on the silicon substrate. Silicon nitride (SiN), silicon oxide (SiO2), aluminum oxide (Al2O3) and the like can be used.

As a method of manufacturing the solar cell according to the present invention, any known methods of forming a thin film can be used such as the wet application method, the chemical vapor deposition method and the sputtering method.

(Formation of Metal Oxide Layer)

When a metal oxide layer is formed by the wet application method, organic compounds or metal chlorides containing titanium, niobium, copper and the like as a component are weighed to give appropriate concentrations to prepare a mixture solution as a raw material solution. Among organic compounds, in particular, alkoxide-based organic compounds are preferred, and organic compounds such as tetrabutoxide, ethoxide, and isopropoxide can be used.

For a particular approach of forming a thin film by the wet application method, the spray coating method, the dip coating method, the spin coating method, the slit coating method, the ink-jet method and the like can be used.

As an example, a method of forming a metal oxide by the slit coating method will be described. The slit coating method involves filling a metal container with a raw material solution, and introducing an inert gas into the container to apply pressure, thereby discharging the raw material solution from a slit-like opening formed at a lower part of the container. A substrate is moved while discharging the raw material solution. This can allow the raw material solution to be applied thinly and uniformly to the entire surface of the substrate. Further, a desired application pattern may be obtained by changing the shape and dimension of the opening, and transforming and controlling the form of the discharge pressure into a pulse.

A silicon substrate on which the raw material solution has been applied in a predetermined pattern is dried at a predetermined temperature, and then subjected to heat treatment for calcination, thereby evaporating a solvent and allowing a chemical reaction to yield an oxide. The drying temperature is preferably 150° C. to 300° C. The temperature of heat treatment for calcination is preferably 400° C. to 700° C. In a case where the heat treatment temperature is lower than 400° C., carbon from the solution will remain in a metal oxide layer deteriorating adhesiveness with copper wiring and worsen a value of the interfacial contact resistance. In a case where it is more than 700° C., an interface reaction between a metal oxide layer and a silicon substrate will take place, resulting in impaired pn junction of the silicon substrate and deteriorated power generation efficiency. The heat treatment time is preferably 5 minutes or more to 30 minutes or less. In particular, it is more preferably 10 minutes or more to 20 minutes or less in view of improved adhesiveness.

The atmosphere when performing heat treatment for calcination preferably contains oxygen, and is preferably an oxidizing atmosphere with an oxygen concentration of 100 ppm or more. Assuming that the total pressure is the atmospheric pressure, the oxygen concentration of 100 ppm or more corresponds to an oxygen partial pressure of 100 Pa or more. In a case where the concentration is less than 100 ppm, oxidation will not fully progress. Therefore, carbon from the solution may remain to impair adhesiveness with copper wiring even if the heat treatment temperature falls within the above range.

(Formation of Copper Wiring)

Copper wiring is printed on a silicon substrate by screen printing using a copper paste in which a solvent and resin are mixed with copper powder. A sample after printing is dried at a temperature of 150° C. to 250° C. to removes a highly volatile solvent. Then, as a first heat treatment, calcination (roast) is performed at a temperature of 350° C. to 600° C. under an oxygen-containing atmosphere to remove a resin component, through which the particulate copper becomes copper oxide. Subsequently, as a second heat treatment, calcination is performed at a temperature of 350° C. to 600° C. under an atmosphere containing carbon monoxide, alcohol or hydrogen, through which the copper oxide particles are reduced to copper particles. The copper particles are then sintered. In a case where the heat treatment temperature is lower than 350° C., resin will remain in the wiring, resulting in not only deteriorated adhesiveness with a silicon substrate, but also increased wiring resistance. Further, in a case where the temperature is higher than 600° C., the diffusion barrier characteristics of a metal oxide is impaired, resulting in dispersion of copper into a silicon substrate. Therefore, the temperature for performing roasting and sintering is preferably 350° C. or more to 600° C. or less. The temperature is preferably 370° C. or more in order to increase a roasting rate, and preferably 550° C. or less in order to increase the reliability of diffusion barrier characteristics. The heat treatment times of the first step (roast) and the second step (reduction and sintering) are both preferably 1 minute or more to 15 minutes or less.

The copper wiring is formed by sintering copper powder particles as a raw material, and consequently has a polycrystalline structure. The void volume ratio and the mean crystal grain diameter can be controlled by adjusting a heating rate to reach a temperature set for each of the heat treatment step.

(Precipitation of Metal Particles within Metal Oxide Layer)

Inclusion of metal particles of copper or nickel precipitated within a metal oxide layer can enhance the adhesiveness of the copper wiring, the metal oxide layer and the silicon substrate, and can also reduce the resistance of the metal oxide layer. Therefore, a metal oxide layer is subjected to heat treatment under a predetermined reducing atmosphere to reduce metal oxide, allowing metal particles of copper or nickel to be finely precipitated within the metal oxide layer.

The heat treatment temperature for reduction and precipitation is preferably 350° C. or more to 600° C. or less. This can provide a peel strength of 1.5 N/mm or more and improved adhesion strength. A temperature lower than 350° C. may produce insufficient reducing effects and fewer precipitated metal particles. Therefore, adhesiveness is less improved. A temperature higher than 600° C. may enhance a tendency of precipitated copper, nickel or the like to disperse into a silicon substrate, and thus is not preferred in view of adhesiveness and interfacial contact resistance. For the reducing atmosphere, an atmosphere in which carbon monoxide, alcohol or hydrogen is contained in nitrogen gas or inert gas can be used.

For the heat treatment in which metal particles are precipitated within a metal oxide layer under a reducing atmosphere, two different methods can be used. The first method comprises performing a predetermined heat treatment before printing a copper paste to effect reduction and precipitation.

The second method comprises printing a copper paste, and performing a first heat treatment for roasting, and then performing a second heat treatment as a sintering process under a reducing atmosphere for a prolonged time of more than 15 minutes, thereby effecting reduction and precipitation. A short heat treatment time (about 1 minute) may be sufficient for reducing copper oxide to sinter copper particles. However, reduction and precipitation may require longer time because copper or nickel within a metal oxide layer located at a lower part of copper wiring can not easily be reached by a reducing gas component, and in addition, may strongly be bound within the metal oxide layer. Therefore, a longer heat treatment time is required as compared with a time required for reduction and sintering of copper oxide. In a case where reduction and precipitation are involved, the heat treatment time in the second step is preferably 15 minutes to 30 minutes.

(Formation of Antireflection Film)

An antireflection film is formed on a silicon substrate by the vapor-phase deposition method. The plasma-enhanced chemical vapor-phase deposition method (PECVD), the atomic layer deposition method (ALD) and the like can be used. Subsequently, an opening is formed at a portion where copper wiring is formed. The laser ablation method and the chemical etching method using an acidic solution such as hydrofluoric acid and phosphoric acid can be used. The film thickness is preferably 30 to 100 nm.

EXAMPLES

Below, the present invention will be described in more detail with reference to Examples, but the present invention shall not be limited to these Examples.

Example 1

A monocrystalline p-type silicon wafer with a dimension of 156 mm square and 0.2 mm thickness was used as a silicon substrate. The p-type impurity was boron (B) and the impurity concentration was about $1 \times 10^{16}$ cm-3. The upper surface of this wafer was etched with a KOH solution, and a texture structure with unevenness was formed. Subsequently, after $POCl_3$ was applied to the upper surface, heat-treatment was performed at high temperature to diffuse phosphorus (P) into silicon, thereby forming an n+ region. The concentration of P was up to about $1 \times 10^{19}$ cm-3. A silicon substrate having n-p junction was produced in this way.

As a raw material solution, a mixture solution comprising a Ti-based alkoxide compound, an Nb-based alkoxide compound, and a solvent was prepared. A slit coating device was used to uniformly apply the raw material solution on the silicon substrate. The substrate on which the solution had been applied was dried at about 200° C., and then calcined by performing heat treatment for 10 minutes at 600° C. and the atmospheric pressure under an oxygen-containing atmosphere to form a metal oxide layer with a thickness of about 30 nm comprising $(Ti_{1-x-y}Nb_xCu_y)O_{2-z}$.

Next, a copper powder with the mean particle diameter of about 1 μm, ethyl cellulose (binder resin) and butylcarbitol acetate (solvent) were mixed to prepare a copper paste comprising 10 wt % of an organic vehicle and 7 wt % of the resin relative to the copper particles. The above copper paste was used to print copper wiring on the silicon substrate by the screen printing method. The sample after printing was dried at about 200° C., and then subjected to a first heat treatment at about 370° C. for 10 minutes under an oxygen-containing atmosphere to remove a resin component, and subsequently, a second heat treatment was performed at about 500° C. for 5 minutes under a hydrogen-containing atmosphere to sinter the copper particles.

The composition of the resulting metal oxide layer was (Ti0.82Nb0.06Cu0.12)O2−z.

Electric resistivity, adhesiveness, visible light transmittance and diffusion barrier characteristics were measured and evaluated.

(Electric Resistivity)

The electric resistivity of the copper wiring in a test sample was measured at 3 locations: the center and both ends of a bus electrode in the longitudinal direction using the direct-current four probe method. The cross section of the wiring used for calculating the electric resistivity was computed after acquiring the three-dimensional shape data of the wiring under a laser microscope.

(Adhesiveness)

The adhesiveness of the copper wiring was measured in accordance with JIS specification D0202-1988. A layer of the copper wiring was cut in a net shape with a knife at equal intervals to obtain a distinct region with 10×10 cells. A stretch of cellophane tape was attached on the surface of that portion, and then detached.

The adhesion strength was quantitatively evaluated in accordance with JIS specification 5016-1994. The end portion of the copper wiring was detached from the silicon substrate, and fixed to the grip jig of a tension tester, and the adhesion strength (N/mm) was determined by dividing the peeling force (N) exerted when stretching it in the direction perpendicular to the substrate surface by the wiring width (mm).

(Visible Light Transmittance)

The visible light transmittance of the metal oxide layer was measured by a method in accordance with JIS specification R3106-1998. A UV-Vis-NIR spectrophotometer V-670 from Jasco Corp. was used to measure a light transmittance at each wavelength from 190 nm to 2700 nm. These wavelengths fall into an ultraviolet, visible and near-infrared regions. A test sample in which a metal oxide layer with a film thickness of about 30 nm was formed on a highly transmissive quartz glass substrate was used in the measurements because a silicon substrate was poorly transmissive. An intensity of the light transmittance of air measured without placing a metal oxide layer was used as the reference value for transmittance, which was taken as 100%. A transmittance of the above test sample was measured, and then a transmittance of the quartz glass substrate alone was measured as a sample. Then, a light transmittance of the metal oxide layer was obtained by arithmetically subtracting the latter from the former. In particular, the transmittance at a wavelength of 500 nm was defined as the visible light transmittance.

(Diffusion Barrier Characteristics)

A silicon substrate on which a metal oxide layer and the like were formed was held under reduced pressure, and heat treatment was performed at 500° C. for 30 minutes. Subsequently, the back side of the silicon substrate was ground to make it thinner, and then a composition distribution in the thickness direction was analyzed with a secondary-ion mass spectrometer (SIMS). In order to precisely analyze whether or not copper atoms were diffused into a silicon substrate, sputter-sectioning was performed from the side of the silicon substrate, and the SIMS analysis was then sequentially performed. The extent of interdiffusion of copper and silicon upon a prolonged heat treatment at high temperature was evaluated by measuring the intensity of secondary ions of copper atoms in the silicon substrate as described above.

The electric resistivity of the copper wiring from Example 1 was 3.2 μΩcm, and the adhesion strength of the copper wiring was 2.3 N/mm, and the visible light transmittance of the metal oxide layer at a wavelength of 500 nm was 93%. Further, after a heat treatment at 500° C. for 30 minutes, copper atoms were found to be below the detection limit, and interdiffusion of Cu and Si was not observed, indicating that good diffusion barrier characteristics were obtained.

Moreover, the copper wiring formed had a thickness of about 28 μm, and showed a polycrystalline structure, and had a void volume ratio of about 15%. The void volume ratio was measured by processing a portion of the wiring with an ion beam to expose a cross section, and analyzing the image of a cross-sectional structure obtained with a scanning electron microscope. The mean crystal grain diameter was about 1.6 μm. The mean crystal grain diameter was determined by analyzing the image of a crystal orientation distribution obtained using an electron backward scattering pattern (EBSP) observation instrument included in a scanning electron microscope.

Example 2

An antireflection SiN film with a thickness of 80 nm was deposited on the surface of the silicon substrate having n-p junction from Example 1 by the plasma-enhanced chemical vapor-phase deposition method (PECVD). Then, a portion in which copper wiring was to be formed was removed by the laser ablation method.

A metal oxide and copper wiring were formed on the above silicon substrate on which the antireflection film had been formed, under similar conditions as in Example 1.

The electric resistivity of the copper wiring was 3.3 μΩcm, the adhesion strength of the copper wiring was 1.9 N/mm, and the visible light transmittance of the metal oxide layer at a wavelength of 500 nm was 92%. Further, after a heat treatment at 500° C. for 30 minutes, copper atoms were found to be below the detection limit, and interdiffusion of Cu and Si was not observed, indicating that good diffusion barrier characteristics were obtained.

Example 3

After forming a metal oxide layer comprising copper, titanium, niobium on a silicon substrate at a thickness of about 30 nm under similar conditions as in Example 1, heat treatment was performed for 10 minutes at a temperature of 500° C. and an ambient pressure of 104 Pa under a reducing atmosphere in which 5% hydrogen was mixed in nitrogen. In the structure after the heat treatment, copper particles were precipitated in the metal oxide comprising titanium and niobium. The mean diameter of the copper particles was about 5 nm.

Then, copper wiring was formed by the method described in Example 1. The electric resistivity of the copper wiring was 3.0 μΩcm, the adhesion strength of the copper wiring was 4.2 N/mm, and the visible light transmittance of the metal oxide layer at a wavelength of 500 nm was 90%. Further, after a heat treatment at 500° C. for 30 minutes, copper atoms were found to be below the detection limit, and interdiffusion of Cu and Si was not observed, indicating that good diffusion barrier characteristics were obtained.

A thin test piece prepared with a convergence ion microscope was observed for a structure after the heat treatment under a transmission electron microscope. The mean diameter of the precipitated copper particles was determined by selecting 20 copper particles observed in a light field image under a transmission electron microscope as analysis objects, and measuring the maximum diameter and the minimum diameter of each particle, and then computing the mean value of them.

Example 4

A metal oxide layer comprising copper, titanium, and niobium was formed at a thickness of about 30 nm on a silicon substrate under similar conditions as in Example 1. In the subsequent formation of copper wiring, a copper paste was printed on the metal oxide layer, and subjected to a first heat treatment at 370° C. under an oxidizing atmosphere, and then heat treatment was performed as a second heat treatment for 20 minutes at a temperature of 500° C. and an ambient pressure of 104 Pa under a reducing atmosphere in which 5% hydrogen was mixed in nitrogen. In the structure after the heat treatment, copper particles were precipitated in the metal oxide comprising titanium and niobium at a lower portion of the copper wiring. The mean diameter of the copper particles was about 7 nm.

The electric resistivity of the copper wiring was 2.9 μΩcm, the adhesion strength of the copper wiring was 3.8 N/mm, and the visible light transmittance of the metal oxide layer at a wavelength of 500 nm was 91%. Further, after a heat treatment at 500° C. for 30 minutes, copper atoms were found to be below the detection limit, and interdiffusion of Cu and Si was not observed, indicating that good diffusion barrier characteristics were obtained.

Example 5

A metal oxide layer was formed on a silicon substrate using a chemical vapor deposition system. A precursor as a raw material was heated at about 80° C., and introduced into a deposition chamber using an argon gas as a carrier gas. At the same time, a small amount of water vapor was introduced into the deposition chamber using an argon gas as a carrier gas. The degree of vacuum in the deposition chamber was about 10-4 Pa. The composition of the metal oxide to be formed was adjusted by adjusting the flow rate of the argon gas. The silicon substrate was maintained at about 300° C., and a metal oxide layer was formed at a thickness of about 30 nm for a deposition time of about 20 minutes.

Subsequently, copper wiring was formed on the silicon substrate having the metal oxide under similar conditions as in Example 1. The electric resistivity of the copper wiring was 3.0 μΩcm, the adhesion strength of the copper wiring was 2.2 N/mm, and the visible light transmittance of the metal oxide layer at a wavelength of 500 nm was 92.5%. Further, after a heat treatment at 500° C. for 30 minutes, copper atoms were found to be below the detection limit, and interdiffusion of Cu and Si was not observed, indicating that good diffusion barrier characteristics were obtained.

Note that the film thickness after deposition was increased linearly over the deposition times as follows: 1.5 nm, 7.8 nm, 16.0 nm, 26.3 nm and 30.0 nm at a deposition time of 1 minute, 5 minutes, 10 minutes, 15 minutes and 20 minutes, respectively.

Example 6

A metal oxide layer was formed on a silicon substrate using a high frequency magnetron sputtering device. A sintered compact in which oxide powders of constituting elements were mixed in an appropriate ratio was used as a sputtering target. A mixed gas of argon and 5 vol % oxygen was used as a sputtering gas. The degree of vacuum in the deposition chamber was about 10-6 Pa. The sputtering power was set at 50 W, and metal oxides were deposited at a thickness of about 30 nm. The composition of the metal oxide was adjusted by changing the composition of the sintered compact target.

Subsequently, copper wiring was formed under similar conditions as in Example 1. The electric resistivity of the copper wiring was 2.9 μΩcm, the adhesion strength of the copper wiring was 3.4 N/mm, and the visible light transmittance of the metal oxide layer at a wavelength of 500 nm was 92%. Further, after a heat treatment at 500° C. for 30 minutes, copper atoms were found to be below the detection limit, and interdiffusion of Cu and Si was not observed, indicating that good diffusion barrier characteristics were obtained.

EXPLANATION OF REFERENCE NUMERALS

1 Silicon substrate
10 Copper wiring
100 Metal oxide layer
20 Antireflection film

The invention claimed is:

1. A silicon solar cell having a silicon substrate, comprising:
   a metal oxide layer formed on the silicon substrate, and copper-based wiring formed on the metal oxide layer,
   wherein the metal oxide layer consists of:
      (a) either one of titanium or manganese;
      (b) one of vanadium, niobium, tantalum or silicon;
      (c) at least one of copper and nickel; and
      (d) oxygen,
   wherein the metal oxide layer comprises 5 atom % or more to 20 atom % or less of copper and nickel in total, and
   wherein the at least one of the copper and the nickel is dispersed as a precipitate of metal particles throughout the inside of the metal oxide layer.

2. The silicon solar cell according to claim 1, comprising:
   an antireflection film formed on the silicon substrate and having an opening,
   wherein the metal oxide layer is formed on the silicon substrate at least within the opening.

3. The silicon solar cell according to claim 2, wherein the opening of the antireflection film has a shape in accordance with a pattern of the wiring.

4. The silicon solar cell according to claim 2, wherein the metal oxide layer is extended to and formed on the antireflection film.

5. The silicon solar cell according to claim 2, wherein the wiring is extended to and formed on the antireflection film.

6. The silicon solar cell according to claim 1, wherein the metal oxide layer comprises 2 atom % or more to 10 atom % or less of vanadium, niobium or tantalum.

7. The silicon solar cell according to claim 1, wherein the metal oxide layer comprises 20 atom % or more to 60 atom % or less of silicon.

8. The silicon solar cell according to claim 1, wherein the wiring has a polycrystalline structure, a void volume ratio of 30% or less and a mean crystal grain diameter of 0.5 μm or more to 3.0 μm or less.

9. A method of manufacturing a silicon solar cell, the method comprising:
   forming a metal oxide layer on a silicon substrate, and forming copper-based wiring on the metal oxide layer,
   wherein the metal oxide layer consists of:

(a) either one of titanium or manganese;
(b) one of vanadium, niobium, tantalum or silicon;
(c) at least one of copper and nickel; and
(d) oxygen, wherein the metal oxide layer comprises 5 atom % or more to 20 atom % or less of copper and nickel in total, and wherein the at least one of the copper and the nickel is dispersed as a precipitate of metal particles throughout the inside of the metal oxide layer.

10. The method of manufacturing a silicon solar cell according to claim 9, the method comprising:

forming an antireflection film having an opening on the silicon substrate, wherein the metal oxide layer is formed on the silicon substrate at least within the opening.

11. The method of manufacturing a silicon solar cell according to claim 10, wherein the opening of the antireflection film has a shape in accordance with a pattern of the wiring.

12. The method of manufacturing a silicon solar cell according to claim 9, wherein the forming of the metal oxide layer further comprises: performing heat treatment at a temperature of 350° C. or more to 600° C. or less under an atmosphere containing carbon monoxide, alcohol or hydrogen to effect reduction of the metal oxide layer and precipitation of the metal particles of the at least one of the copper and the nickel that is dispersed as the precipitate of the metal particles throughout the inside of the metal oxide layer.

13. The method of manufacturing a silicon solar cell according to claim 9, wherein the forming of the wiring comprises: printing and applying a copper paste on the metal oxide layer, and then performing a first heat treatment at a temperature of 350° C. or more to 600° C. or less under an oxygen-containing atmosphere, and then performing a second heat treatment at a temperature of 350° C. or more to 600° C. or less under an atmosphere containing carbon monoxide, alcohol or hydrogen.

14. The method of manufacturing a silicon solar cell according to claim 13, further comprising reducing the metal oxide layer and precipitating the metal particles of the at least one of the copper and the nickel throughout the inside of the metal oxide layer by the second heat treatment.

15. The method of manufacturing a silicon solar cell according to claim 10, comprising: forming the opening of the antireflection film into a wiring pattern by the laser ablation method or the chemical etching method.

* * * * *